US008456175B2

(12) United States Patent
Marchetti et al.

(10) Patent No.: US 8,456,175 B2
(45) Date of Patent: Jun. 4, 2013

(54) OPEN LOOP LOAD PULL ARRANGEMENT WITH DETERMINATION OF INJECTIONS SIGNALS

(75) Inventors: Mauro Marchetti, Tilburg (NL); Marco Johannes Pelk, Rotterdam (NL); Leonardus Cornelis Nicolaas De Vreede, Pijnacker (NL)

(73) Assignee: Anteverta-MW B.V. (NL)

( * ) Notice: Subject to any disclaimer, the term of this patent is extended or adjusted under 35 U.S.C. 154(b) by 367 days.

(21) Appl. No.: 12/989,058

(22) PCT Filed: Apr. 1, 2009

(86) PCT No.: PCT/NL2009/050168
§ 371 (c)(1),
(2), (4) Date: Dec. 3, 2010

(87) PCT Pub. No.: WO2009/131444
PCT Pub. Date: Oct. 29, 2009

(65) Prior Publication Data
US 2011/0163762 A1 Jul. 7, 2011

(30) Foreign Application Priority Data

Apr. 21, 2008 (EP) .................................... 08154849
Jun. 12, 2008 (EP) .................................... 08158127
Jan. 20, 2009 (EP) .................................... 09150923

(51) Int. Cl.
*G01R 27/28* (2006.01)
*G01R 27/32* (2006.01)
*G01R 23/00* (2006.01)

(52) U.S. Cl.
USPC .................... 324/615; 324/646; 324/76.19

(58) Field of Classification Search
USPC .............. 324/615, 612, 600, 642, 637, 76.19, 324/534, 638, 646, 76.22
See application file for complete search history.

(56) References Cited

U.S. PATENT DOCUMENTS

| 6,639,393 | B2* | 10/2003 | Tasker et al. ............... 324/76.19 |
| 2007/0182424 | A1 | 8/2007 | Benedikt et al. |
| 2007/0194776 | A1 | 8/2007 | Bossche |
| 2011/0025296 | A1* | 2/2011 | Benedikt et al. ........... 324/76.19 |
| 2012/0007605 | A1* | 1/2012 | Benedikt ...................... 324/612 |
| 2012/0161784 | A1* | 6/2012 | Benedikt ...................... 324/612 |

OTHER PUBLICATIONS

Arthaber, et al., "A Broadband Active Harmonic Load-Pull Setup With a Modulated Generator As Active Load", 34th European Microwave Conference, Amsterdam 2004, 4 pgs. (pp. 685-688).

(Continued)

*Primary Examiner* — Hoai-An D Nguyen

(57) ABSTRACT

Measurement arrangement and method for active load pull measurements of a device under test (1). A wideband analog-to-digital conversion block (3) is provided for obtaining measurement data. First and second injection signal generators (7, 8) are connected to a source side and a load side of the device under test (1). This set up allows to create predetermined reflection coefficients at reference planes of the device under test (1). Injection signal parameters as determined are converted into the injection signals at the source and load side by digital-to-analog conversion. The wideband analog-to-digital conversion block (3) is further arranged for analog-to-digital conversion of the intermediate frequency signals to obtain the actual measured reflection coefficient versus frequency functions with a first frequency resolution. The first frequency resolution applied in the analog-to-digital conversion is equal to or better than a second frequency resolution applied in the digital-to-analog conversion.

26 Claims, 10 Drawing Sheets

OTHER PUBLICATIONS

Hashmi, et al., "A Broadband Control Electronics for Envelope Load Pull System", IEEE, 2007, 4 pgs. (pp. 197-200).

Marchetti, et al., "Active Harmonic Load-Pull With Realistic Wideband Communications Signals", IEEE Transactions on Microwave Theory and Techniques, vol. 56, No. 12, Dec. 2008, 10 pages (pp. 2979-2988).

International Search Report dated Sep. 15, 2009 in connection with PCT/NL2009/050168 (3 pages).

* cited by examiner

OPEN LOOP LOAD PULL ARRANGEMENT WITH DETERMINATION OF INJECTIONS SIGNALS

FIELD OF THE INVENTION

The present invention relates to an open-loop load-pull measurement approach which facilitates the full control and measurement of the reflection coefficients offered to a device under test (DUT) at base band, fundamental and harmonic frequencies over a large modulation bandwidth.

PRIOR ART

American patent publication US2007/0194776 discloses a real-time load-pull arrangement which allows setting and measurement of the device reflection coefficients for the fundamental in one shot. This approach can be used only with single tone input stimulus to the device under test and is not suitable for wideband modulated signals.

American patent publication US 2007/0182424 discloses an implementation of load control in (closed) feedback loops by making use of frequency down conversion techniques to implement the filter functions at a lower frequency which is easier. However, the proposed solution assumes a time continuous feedback action for the active loop to realize the intended reflection coefficient. The use of frequency down-conversion in this document is only to implement a filter action and/or limiting function for the gain. Note that in a feedback system the original data emanating of the device is taken as an input modified for its phase and amplitude and fed back to the active device, this in contrast to open loop systems (such as the present invention) where the desired signal level to be injected into the active device is found by optimization/iteration techniques and no (re)use is made of the emanating waves for obtaining these signals.

The article 'A broadband active harmonic load-pull setup with a modified generator as active load' by H. Arthaber et al, 34th European Microwave Conference, Amsterdam, 2004, discloses a load-pull setup allowing broadband active loads to test a device under test. The arrangement uses a single modulated RF source for the generation of the required backward travelling wave. The use of a single reference frequency in the test arrangement is mentioned in order to improve accuracy. However, for wideband modulated signals, this arrangement is not practical.

The article 'A broadband control electronics for envelop load pull system' by M. S. Hasmi et al, International Symposium on Signals and Systems, 2007, discloses a control electronics for the envelope load-pull setup described in American patent publication US 2007/0182424 which allows broadband active loads to test with wideband modulated signals by minimizing the phase delay in the closed loop. Note that in this case there is no independent control of the reflection coefficient in the modulation bandwidth, therefore the phase delay and the gain variations across the bandwidth are only reduced, but they are still present. For these reasons there is still a fundamental limitation on the maximum bandwidth that can be controlled (within the 13 MHz as specified by the authors there will be still some phase change with frequency). Also the dynamic range of the proposed arrangement will be very limited.

SUMMARY OF THE INVENTION

The present invention seeks to provide an improved load pull measurement arrangement and method, which allows a broader application range (higher frequencies, more broadband, wideband multi-tone).

According to the present invention, a method according to the preamble defined above is provided, in which the method comprises supplying an input source signal at the source side of the device under test and injection signals at the source and load side of the device under test for creating predetermined reflection coefficients at respective reference planes of the device under test, the predetermined reflection coefficients comprising desired reflection coefficient versus frequency functions at or around a fundamental frequency and at or around one or more harmonic frequencies, and for each of the fundamental and one or more harmonic frequencies:

obtaining measurement data at the source and load side of the device under test and determining from the measurement data actual measured reflection coefficient versus frequency functions, determining injections signal parameters by iteratively comparing the actual measured reflection coefficient versus frequency functions with the desired reflection coefficient versus frequency functions, converting the injection signal parameters into the injection signals at the source and load side by digital-to-analog conversion, in which obtaining measurement data comprises down conversion of measured signals at the source and load side of the device under test to intermediate frequency signals, analog-to-digital conversion of the intermediate frequency signals to obtain the actual measured reflection coefficient versus frequency functions with a first frequency resolution, and in which the first frequency resolution applied in the analog-to-digital conversion is equal or better than a second frequency resolution applied in the digital-to-analog conversion.

These features in combination allow to use an open loop approach, with a frequency binned optimization of the reflection coefficients. The proposed approach solves for the electrical delay present in existing load-pull systems, and facilitates therefore realistic, circuit like conditions also for very wide-band signals (bandwidth >10 MHz). In fact the user can specify arbitrary reflection coefficients versus frequency for the frequency bands at fundamental and harmonic frequencies. The proposed approach also overcomes the non-linearity limitations that are related to the amplifiers present in conventional active harmonic load pull systems since deviations caused by these non-linearities will automatically vanish during the iteration process of the injection signals over the desired frequency bands in order to satisfy the conditions related to the specified reflection coefficients.

The term 'at or around a frequency' is used to indicate that wide band applications are possible, but also single tone applications are possible.

In a further embodiment, the source input signal is a wideband signal having a fundamental frequency, and is a periodic signal with a predetermined record length. This allows the open loop approach, as optimization can take place using measurement signals associated with one period, with application of the determined injection signals in the following periods of the source signal. It also allows to take into account broadband signals when using this method.

In a further embodiment, determining injection signal parameters iteratively comprises starting the iterative process using an actual measured reflection coefficient versus frequency function when no injection signals are applied. This will result in a quicker convergence of the iterative optimization process, compared to the use of default values for starting values.

Alternatively, determining injection signal parameters iteratively comprises an iteration based on circuit simulator principles, in which the boundary conditions of the device under test are solved simultaneously. This can be applied for all harmonics and/or an envelope of the modulated signal. The later technique will most likely reduce the number of required iterations and consequently will improve measurement speed.

In an even further embodiment, the injection signals at source and load side of the device under test further comprise a baseband signal, which is generated coherently with the injection signals. This feature has the effect that a bias network impedance of the device under test is provided, and thus provides an additional functionality of the measurement set up.

Converting the injection signal parameters into the injection signals at the source and load side by digital-to-analog conversion comprises in a further embodiment:

inputting injection signal parameters to a waveform generator for each of the fundamental and one or more harmonic frequencies at both the source and load side to form intermediate injection signals, in which the waveform generators share the same time base and are fully synchronized, coherently up-converting each of the intermediate injection signals to the appropriate fundamental and harmonic frequencies to form the actual injection signals.

This embodiment provides an advantageous implementation of the signal generation. Using synchronized and coherent steps for all frequency bands (fundamental and harmonics) provides the requested accuracy for quickly determining the correct injection signals for a desired set of reflection coefficient functions.

In a further embodiment, the digital-to-analog conversion and the analog-to-digital conversion are synchronized to a single coherent source. This first provides a reduction of circuitry needed for implementing the present method, but also guarantees a proper and efficient functioning.

Pre-distorting the input source signal may be used in a further embodiment. Although this is only possible when all elements in the measurement set up are fully synchronized, it allows to compensate for non-linearities of power amplifiers in the input path of the measurement system, resulting in higher accuracy and efficiency.

Furthermore, the method may further comprise calculating actual losses and delays in the measurement system and compensating for the calculated actual losses and delays in the predetermined reflection coefficients (in every frequency bin). An implementation may use wideband linear S-parameter measurements and compensation in signal generation, for every frequency bin in the whole modulation bandwidth around fundamental and harmonic frequencies.

In a further embodiment, the predetermined reflection coefficients comprise predefined time varying reflection coefficients. This allows to mimic device test conditions that relate to amplifiers using load modulation (e.g. Doherty, LINC or dynamic loadline amplifiers).

In a further set of embodiments, the method further comprises providing a plurality of time segmented and sequenced injection signals at the source and load side of the device under test, in which each of the plurality of time segmented and sequenced injection signals comprises the fundamental frequency or a harmonic thereof, and in which one or more of the plurality of time segmented and sequenced injection signals comprises a different amplitude and phase. Such an open-loop load-pull measurement method entails that high-speed (multidimensional) parameter sweeps are implemented through the use of time-segmented and sequenced injection signals at the source and load side of the device under test. These segmented sinusoidal signals all have a frequency that is exactly equal to fundamental operating (evaluation) frequency of the device under test, or their frequency is set equal to one of the harmonics of the device under test. The amplitude and/or phase of the sinusoidal signals in the different time segments are set different to implement the (multi dimensional) parameter sweep. Using the present embodiment it is possible to perform very complex and extensive measurements of a device under test in a very short time frame, much shorter than possible in prior art arrangements.

The amplitude and phase of the plurality of time segmented and sequenced injection signals are adapted to obtain a predefined sweep of an operational parameter of the device under test in a further embodiment. The desired (user specified) measurement conditions of the swept parameters, e.g. source or load reflection coefficients, can be obtained very accurately by optimization of the phase and amplitude of the sinusoidal signal in the time-segmented waveforms.

In an even further embodiment, digital-to-analog conversion and analog-to-digital conversion is synchronized to the plurality of time segmented and sequenced injection signals using a trigger signal. This assures that conditions of measurements are kept reliable and accurate.

In a further aspect, the present invention relates to a measurement arrangement for active load pull measurements of a device under test, comprising a wideband analog-to-digital conversion block connected to the source side and load side of the device under test for obtaining measurement data for each of the fundamental and one or more harmonic frequencies at the source and load side of the device under test, determining from the measurement data actual measured reflection coefficient versus frequency functions, and determining injections signal parameters by iteratively comparing the actual measured reflection coefficient versus frequency functions with the desired reflection coefficient versus frequency functions, a first injection signal generator connected to a source side of the device under test and a second injection signal generator connected to a load side of the device under test for supplying an input source signal and injection signals in order to create predetermined reflection coefficients at respective reference planes of the device under test, the predetermined reflection coefficients comprising desired reflection coefficient versus frequency functions at or around a fundamental frequency and at or around one or more harmonic frequencies, the first and second injection signal generator comprising arbitrary waveform generators for converting the injection signal parameters into the injection signals at the source and load side by digital-to-analog conversion, in which the wideband analog-to-digital conversion block is connected to couplers which are connected to the source and load side of the device under test, and the couplers comprise down-converters of measured signals to obtain intermediate frequency signals, and the wideband analog-to-digital conversion block is further arranged for analog-to-digital conversion of the intermediate frequency signals to obtain the actual measured reflection coefficient versus frequency functions with a first frequency resolution, and in which the first frequency resolution applied in the analog-to-digital conversion is equal or better than a second frequency resolution applied in the digital-to-analog conversion.

This provides for an efficient and cost-effective implementation for executing the method according to the above described embodiments.

In a further embodiment, the measurement arrangement further comprising a base band signal generator and associated couplers connected to the device under test, for generating a base band signal which is generated coherently with the source signal and injection signals. As in the corresponding embodiment described above, this provides the effect of providing a desired bias network impedance of the device under test.

The measurement arrangement and its components alone or in combination may be further arranged to execute the method according to the embodiments described above.

SHORT DESCRIPTION OF DRAWINGS

The present invention will be discussed in more detail below, using a number of exemplary embodiments, with reference to the attached drawings, in which FIG. 1 shows a schematic block diagram of a measurement arrangement according to an embodiment of the present invention;

DETAILED DESCRIPTION OF EXEMPLARY EMBODIMENTS

The proposed open loop load pull system allows full control and measurement of reflection coefficients offered to a device under test (DUT) 1 at baseband, fundamental and harmonic frequencies over a large modulation bandwidth. The system is characterized by the fact that the source test signals as well as all the injection signals (a-waves) needed to realize the virtual matching conditions of the DUT 1 are all originating from arbitrary waveform generators, which share the same time base, record data length and are fully synchronized. By using coherent up-conversion of these signals with I/Q modulators as described in various embodiments below (or with frequency mixers in an alternative embodiment) when using a digital IF approach, the source signal offered to the device under test 1 as well as all the injection signals needed to create the artificial reflection coefficients at the fundamental and optionally harmonics frequencies offered to the device under test 1 are created. In addition, base-band impedance control can also be implemented through this technique. Also these (base band) signals should share the same time base and synchronization as the other signals used in the measurement setup. Note that the base band signals in contrast to the other signals in the system are directly fed to the DUT 1 via a frequency multiplexer or suitable bias Tee without frequency up-conversion.

Figure 1:
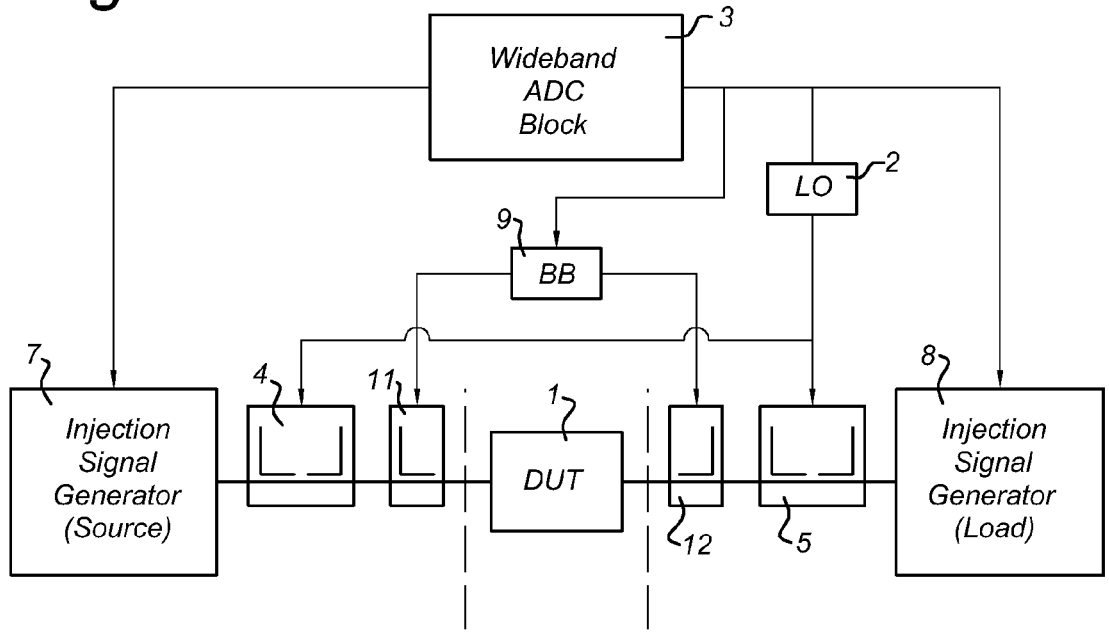

In FIG. 1 a general block diagram is shown of the open loop load pull system. The DUT 1 is indicated with two broken lines at each side, which represent the reference planes for the DUT 1 at the input and output side. The general blocks indicated in FIG. 1 will be explained in further detail below.

Figure 2A:
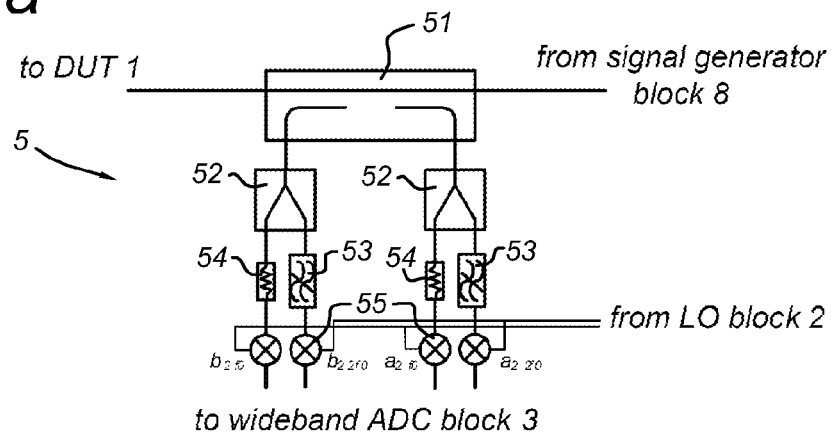
FIG. 2a shows a more detailed block diagram of an embodiment of a coupler as used in the arrangement of FIG. 1.

Measurement signals are obtained at both sides of the DUT 1 using couplers 4, 5, with a down-converting linear mixer 55 or IQ demodulator (see FIG. 2a). For this frequency down conversion it receives a local oscillator signal from local oscillator block 2. The frequency down-converted measurement signals from both the input side (source) and output side (load) of the DUT 1 are input to a wideband analog-to-digital conversion block 3. As will be described later, this analog-to-digital conversion block 3 provides eventually the information required to find the necessary signals to be injected into the source and load side of the DUT 1. For this injection the waveform information is downloaded in arbitrary waveform signal generators, which are part of injection signal generators 7, 8 as shown in FIG. 1. Also the intended RF test signal is downloaded to an arbitrary waveform signal generator, which in the set-up as shown in FIG. 1 is considered to be part of injection signal generator 7 (source). The waveform generation can be of the IQ type (or a digitally generated IF), the resulting signals of these generators are frequency up-converted. The signals needed to control the reflection coefficients at the different frequency are combined using frequency combining networks (e.g. a diplexer of triplexer), which again form part of the injection signal generators 7, 8. The resulting signals are presented to the source and load side of the DUT 1 using again the coupler blocks 4, 5. Additionally, also a base band signal can be generated using base band block 9 and respective couplers 11, 12 for the source and load side of the DUT 1. All elements in the present measurement setup use the same reference time base, and are fully synchronised.

Figure 2B:
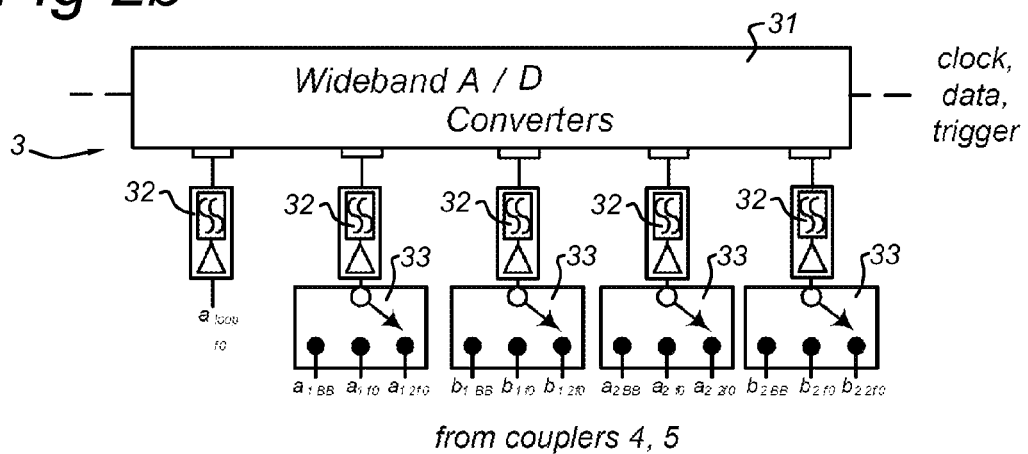
FIG. 2b shows a more detailed block diagram of an embodiment of the wideband analog-to-digital conversion block as used in the arrangement of FIG. 1.
Figure 2C:
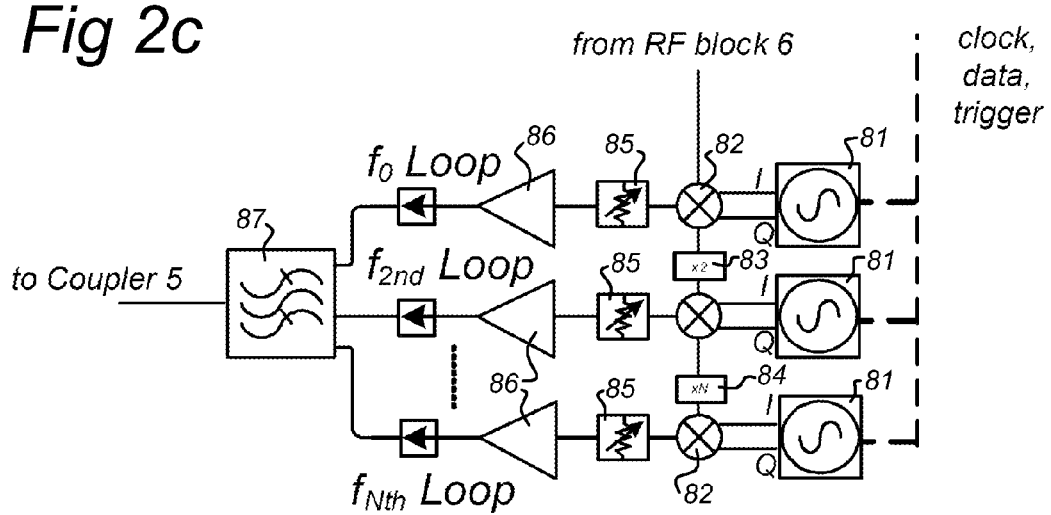
FIG. 2c shows a more detailed block diagram of an embodiment of an injection signal generator as used in the arrangement of FIG. 1.

In FIG. 2a-c, a number of blocks of the block diagram of FIG. 1 are shown in more detail. FIG. 2a shows one of the coupler blocks 4, 5, in this case the coupler block 5 on the load side of DUT 1. The coupler block 5 comprises a coupler 51, which can extract a forward and backward travelling wave from the DUT 1. Each is further split using power splitters 52, and input to a mixer 55 (together with suitable local oscillator signals from LO block 2). In this manner, signals representing $a_{2,f_0}$; $a_{2,2f_0}$; $b_{2,f_0}$; and $b_{2,2f_0}$ are obtained, which are input to the wideband ADC block 3. The frequency splitting of the fundamental and higher harmonics in the detection path is done to maintain the highest possible dynamic range for the higher harmonics, since filtering out the fundamental components reduces the impact of mixer non-linearities when detecting the higher harmonics.

FIG. 2b shows in more detail the wideband ADC block 3. This block comprises the actual analog-to-digital converters 31, one for each of the forward and backward travelling waves at each of the source and load side of the DUT 1, as well as one for the actual source signal ($a_{loop}$). Furthermore, this block comprises a number of selectors 33, the function of which will be explained below. The analog-to-digital converters 31 operate with a first frequency resolution, dependent on the IF down-conversion and the sample rate of the analog-to-digital converters 31.

FIG. 2c shows in more detail one of the signal generator blocks 7, 8, more specifically the signal generator block 8 on the load side of the DUT 1. An arbitrary waveform generator (AWG) 81 is provided, which uses clock, data and trigger signals to generate the I- and Q-parts of the desired waveform. Subsequently, these are fed to the frequency up-converting mixers 82. Since the generated signals need to be frequency converted to the fundamental and harmonic frequencies, the LO signal to drive these IQ up-converting mixers must be close to the test frequency for the fundamental up conversion and be a multiple for the higher harmonics. To generate these signals in a phase coherent fashion multipliers 83, 84 are used to up-convert the LO signal. If necessary, possible leakage of local oscillator signal in the mixer 82 may be suppressed using DC-offsets. In a specific embodiment, which is useable for single tone testing of a DUT 1, the combination of AWG 81 and IQ mixer 82 is arranged as a single side band up-converting mixer.

Switchable attenuators 85 are provided to be able to make optimum use of the dynamic range of the digital-to-analog conversion in the AWG's 81. Via buffers/RF amplifiers 86, the generated signals are combined in a frequency (de-)multiplexing filter 87 for signal injection into the source and load side of the DUT 1. The frequency de-multiplexing filters 87 are used to bring the injection signals for controlling the reflection coefficients for the fundamental and harmonic frequencies together. For each frequency (fundamental and harmonics), a separate AWG 81 is used, allowing to create the amplitude controlled synchronized coherent injection signals for realizing the fundamental and higher harmonic reflection coefficients. A similar hardware implementation may be used for the generation of the base band signal in base band block 9 of FIG. 1, but now directly using an arbitrary waveform generator, a low pass filter, a switchable attenuator and an amplifying buffer. The base band signals are then directly input to the bias T circuitry of couplers 11, 12. The AWG's 81 operate with a second frequency resolution, which is an integer multiple worse than the first frequency resolution associated with the analog-to-digital converters 31.

Figure 3:
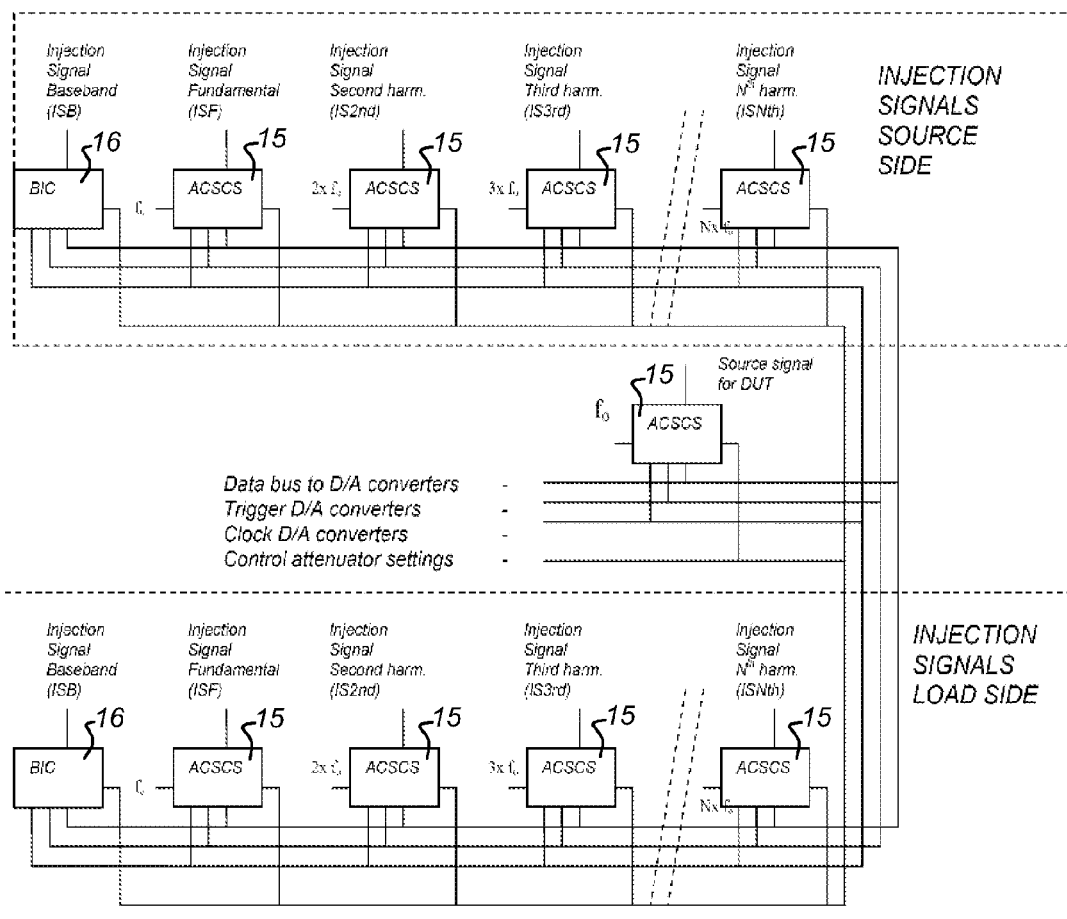
FIG. 3 shows a conceptual diagram of units needed to create the synchronized and coherent injection signals at the desired frequencies at the source and load side of the DUT.

The connection scheme of the units needed to create the synchronized and coherent injection signals at the desired frequencies at the source and load side of the DUT 1 is given in the block diagram FIG. 3. Here it is indicated that it is possible to generate not only baseband and fundamental frequencies, but also second, third and even higher harmonics (up to an Nth harmonic). A combination of one AWG 81, mixer 82, switchable attenuator 85 and buffer 86 is shown in this block diagram as an amplitude controlled synchronized and coherent source (ACSCS) 15, which receives the clock, trigger and data signal, and an attenuator control signal, and outputs an amplitude controlled, synchronized and band modulated signal. Likewise, a combination of an AWG 81, low-pass filter, switchable attenuator 85 and buffer 86 forms a baseband signal injection circuit (BIC) 16. The BIC receives as input the clock, trigger and data signals, and an attenuator control signal, and outputs an amplitude controlled synchronized baseband modulated signal.

As indicated in the block diagram of FIG. 3, a single ACSCS 15 is used to provide the source signal for DUT 1, and a number of ACSCS blocks 15 is used to provide the signals for the source side of the DUT 1. These blocks may be considered as comprised in the injection signal generator 7 on the source side of the DUT 1 as depicted in FIG. 1. Furthermore, the BIC 16 is comprised in baseband block 9, and fed to the DUT 1 using coupler 11 (e.g. using a bias T circuitry). Likewise, also a number of ACSCS blocks 15 are used to provide the test signal at the load side of DUT 1, and are considered as comprised in the injections signal generator 8 on the load side of the DUT 1 in FIG. 1. Again, the single BIC 16 is comprised in baseband block 9 of FIG. 1, and fed to the DUT 1 using coupler 12 (e.g. again using a bias T circuitry).

The circuitry hardware described above offers load pull device characterization with absolute control of the reflection coefficients versus frequency in baseband, and the frequency bands centered at the fundamental and harmonic frequencies at the input and output of the device under test 1. The proposed measurement concept can compensate for losses and phase delays present in the couplers, connecting cables and other components of the measurement setup, as well as it can easily correct for non-linearity imperfections of the amplifiers. Due to its architecture it can also facilitate pulsed device characterization. However, to be operated correctly in a useful way, the signal content of the injection signals need to be determined Ideally the following conditions which are desired to be established for a given device under test 1 are formulated through:

$$a_{x,n}(f_{x,n}) = b_{x,n}(f_{x,n}) \cdot \Gamma_{x,n}(f_{x,n})$$

in which:
  x=index source (s) or load (l)
  n=frequency index: baseband (0), fundamental (1), harmonic (2 and up)
  $\Gamma_{x,n}(f_{x,n})$=an arbitrary user defined function for reflection coefficient of the source ($a_{x,n}$) or load ($b_{x,n}$) versus frequency at the baseband or fundamental or harmonic frequency.

The exact waveforms to be loaded in the Arbitrary Waveform Generators 81 for creating the injection signals are found by enforcing a user defined reflection coefficient versus frequency function (spanning at least a control bandwidth around each of the fundamental and harmonic frequencies). The frequency domain observed is divided in frequency bins. This may be illustrated by an exemplary test set-up for a DUT 1 operating in a W-CDMA environment, which in this case has a fundamental frequency $f_0$=2.14 GHz. A total control bandwidth of 20.4 MHz was used in this experiment. For the AWG's 81, a sampling frequency of 144 MHz was used with a record length of 24000 samples. For the AWG 81 this results in a frequency resolution of 6 kHz (i.e. the bin spacing for generation of signals). For the A/D converters in the wideband ADC block 3, a sampling frequency of 100 MHz was applied, and a record length of $2*10^6$ samples. This results for the measurement part in a frequency resolution of 50 Hz, i.e. the total number of controlled frequency bins in this experiment was 3401 (3401*6 kHz providing the 20.4 MHz total control bandwidth).

By monitoring the deviation of the desired reflection coefficient with the actual measured reflection coefficient for each frequency bin, the spectrum of the injected wave (source and load) is optimized and found by subsequent iterations. The spectral power densities of the incident and emanating waves from the active device (DUT 1) needed in this calculation are captured through using down-conversion to a low IF frequency using a highly linear mixer 55 and are subsequently digitized using wide-band analog-to-digital converters 31. Alternatively, it is also possible to capture the waves through direct down conversion to baseband by using highly linear IQ mixers 55 and wide-band analog-to-digital converters 31 to sample the down-converted I and Q waveforms. The use of wideband analog-to-digital converters 31 allows capturing at once of all the frequency bins for the bandwidth of interest, which should provide sufficient frequency resolution in the optimization/iteration of the spectral content of the injection signals. By changing the LO frequency for the down conversion (in LO block 2, see FIG. 1) the subsequent reflection coefficients for the frequency bands around the fundamental and higher harmonics can be determined (using the selectors 33, see FIG. 2b). The base band information can be directly digitized (see also FIG. 2b).

Figure 4:
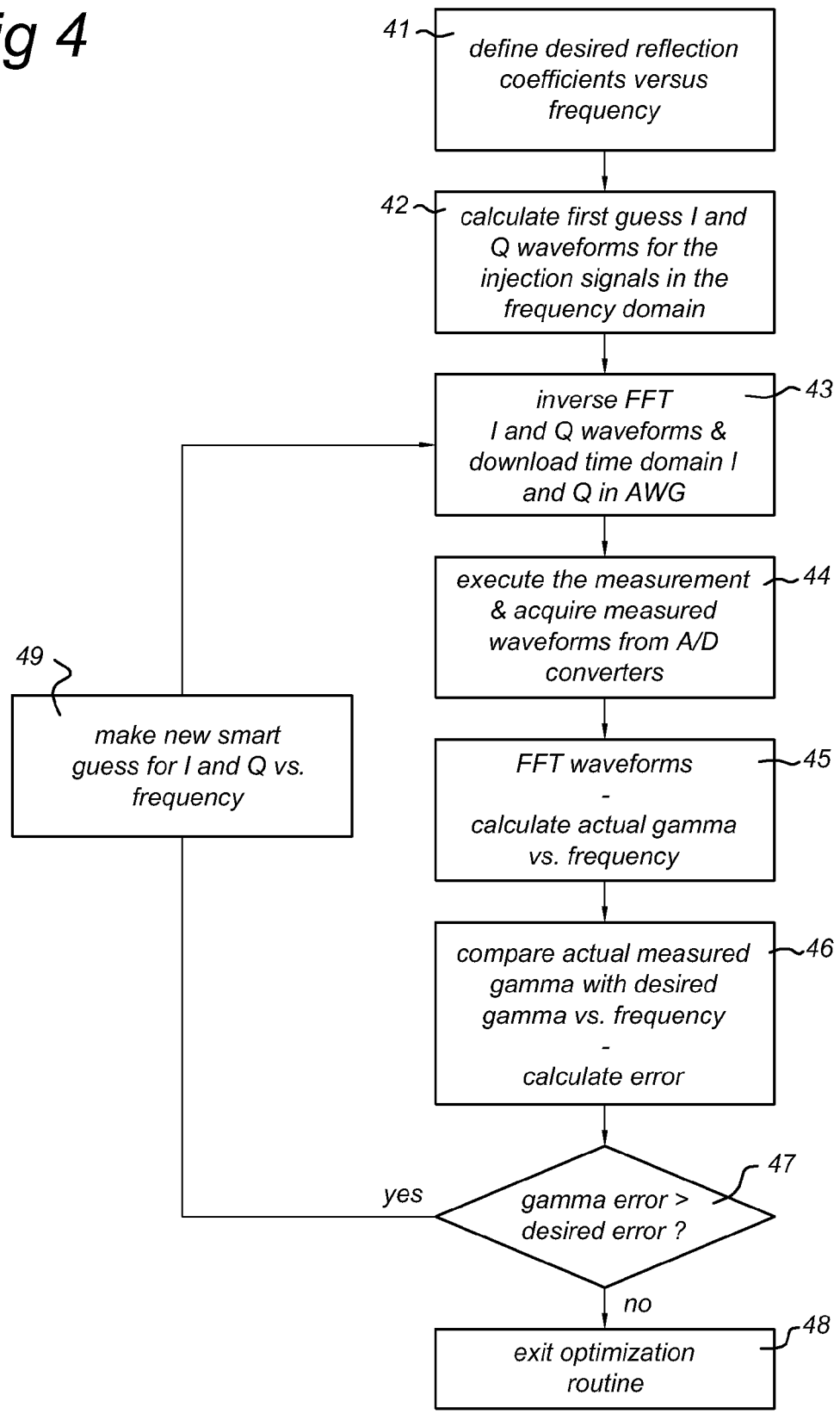
FIG. 4 shows a flow diagram of an implementation of the iterative process for optimizing the desired reflection coefficient parameters.

The iterative process as mentioned above will now be discussed in more detail with reference to the flow diagram as shown schematically in FIG. 4. As mentioned the exact waveforms to be injected are determined based on satisfying the reflection coefficients at the reference planes of the device under test 1 (step 41). The starting point in this process can be an initial reflection coefficient measurement, when no injection signal is applied. As an alternative, a first guess is made of the I and Q waveforms for the injection signals a and b in the frequency domain (step 42). An inverse FFT of the I and Q waveforms is executed (e.g. in a processing system which may be part of the wideband ADC block 3 in FIG. 1), and the time domain I and Q coefficients are input to the AWG's 81 (step 43). Subsequently, the measurement is executed, and measurement data of the waveforms is obtained from the A/D converters 31 in step 44. Again, the measured waveforms are submitted to an FFT operation (e.g. again using the processing system in wideband ADC block 3 in FIG. 1), and the actual reflection coefficient ($\Gamma$) as a function of frequency is determined in step 45 (i.e. using the frequency bins as discussed above). The actual measured F function is compared to the desired $\Gamma$ versus frequency function, and an error function is calculated (step 46). If the error function exceeds a threshold level (indicated by 'desired error' in decision block 47) a new smart guess is made for the I and Q versus frequency (block 48) and a new measurement cycle is started in block 43. If the determined error function is below the threshold level, the iteration algorithm is ended in block 49. Note that the proposed method can accurately control the reflection coefficients/gammas in phase and magnitude over a large frequency band, without being hampered by the electrical delay. In fact the reflection coefficients can be chosen arbitrary as function of frequency.

Consequently the desired waveforms are found through optimization or iteration techniques for each injection signal (baseband, fundamental, harmonics, source side and load side of DUT 1). In an advanced implementation this iteration can be based on circuit simulator principles, which aim to satisfy the boundary conditions of the device under test 1 simultaneously for all harmonics and/or an envelope of the modulated signal. This later technique will most likely reduce the number of required iterations and consequently will improve measurement speed.

It is important to stress that the proposed invention embodiments are not a time continuous system and do not make use of (real time) feedback loops. For this reason the system does not require any synchronization between the analog-to-digital converters 31 used for the reflection coefficients measurements and the Arbitrary Waveform Generators 81 used for creating the injection signals. In the embodiments described above, synchronization is implemented, and this is beneficial if pre-distortion of the input signal is desired (e.g. to compensate for the non-linear behaviour of the input drive amplifier or the non-linearities of the DUT 1 itself). Also, as opposed to closed loop load pull configurations, due to the fact that the desired reflection coefficients are found by subsequent iterations, the loop/buffer amplifiers 86 used for injecting the fundamental and harmonic signals are no longer required to be linear, since the influence of their non-linearities will vanish in subsequent optimization of the reflection coefficients. Consequently, the present embodiments are not bounded by the restrictions related to causal systems which apply to closed loop systems. In the present embodiments, waveforms are used, which are composed out of a repeated data record, which is in general different for all digital-to-analog created injection signals a, b. However, as discussed earlier, all signals created for injection to the device under test 1 need to share the same time base and must be fully synchronized.

Since in the proposed version of a load pull open loop system it is possible to make use of the full waveform record of the source signal and its related reflection coefficients over time, advanced knowledge on the signal events in time is available when iterating for the new injection signals to be fed to the device under test 1. As a result, it is possible to compensate for phase and amplitude errors as well as for phase delay caused by linear and non-linear distortion phenomena. This is a unique feature of the proposed open loop system. Note that these principles will fail in a feedback approach to compensate for the electrical delay, simply because in a time continuous feedback system this is impossible.

Consequently, in contrast to other prior art proposed solutions, the present solution facilitates the use of arbitrary reflection coefficients within a given signal bandwidth, independently for the fundamental and harmonics and even baseband conditions of the device under test 1. This is only possible due to the open loop architecture which relieves the basic limits of implementing a causal function. The use of independent AWG's 81 for the generation of the injection signals is a necessary condition to test the large-signal operation of practical devices, without making pre-assumptions on their electrical behaviour. The proposed approach also automatically overcomes the non-linearity limitations that are normally related to the amplifiers used in an active harmonic load pull system, since these non-linearities will be automatically compensated for in the optimization/iteration of the waveforms of the injection signals in the aim to simply satisfy the predefined user settable relations of reflection coefficients over frequency for the baseband, fundamental and higher harmonics.

In a further embodiment, the same frequency binned optimization approach can be also applied to pre-distort the test signal for the device under test 1 to compensate for the non-linearities of the power amplifiers used in the input path of the system, by smart injection of a signal comprising frequency components that cancel the distortion products. In this case the exact waveforms to be loaded in the Arbitrary Waveform Generators 81 for creating the input signal to the device under test 1 are found by enforcing a user defined amplitude and phase of the test signal versus frequency. By monitoring the deviation of the desired amplitude and phase of the input signal for each frequency bin with the actual measured amplitude and phase, the spectrum of the injected wave is optimized and found by subsequent iterations. Note that this approach requires the synchronization of the Arbitrary Waveform Generators 81 with the analog-to-digital converters 31 in order to be able to measure also the phase of the injected wave.

The frequency resolution for the D/A generated signals (using AWG's 81; second frequency resolution) is, in further embodiments, effectively the same to that of the digitized waveforms by the A/D converters 31 (first frequency resolution), as is expressed by the equation below.

$$\Delta f_{A/D} = \frac{fs_{A/D}}{N_{A/D}} = \frac{\Delta f_{AWG}}{k} = \frac{1}{k} \cdot \frac{fs_{AWG}}{N_{AWG}} = \frac{1}{k \cdot T_{MOD}}$$

where:

$\Delta f_{A/D}$=frequency resolution of the A/D converters (first frequency resolution)

$\Delta f_{AWG}$=frequency resolution of the D/A converters (second frequency resolution)

k=integer $T_{MOD}$=time period of the input signal that allows to meet the requirements of the modulation standard according a given test model $fs_{A/D}$=sampling frequency of the A/D converters 31

$N_{A/D}$=number of samples used by the A/D converters 31

$fs_{AWG}$=sampling frequency of the Arbitrary Waveform Generators 81

$N_{AWG}$=number of samples used by the Arbitrary Waveform Generators 81

This frequency resolution depends on the sampling frequencies and the number of samples for both the synchronized D/A converters in AWG's 81 as well as the A/D converters 31. In principle the frequency resolution of the A/D converters 31 can be an equal to or better than the D/A converters in AWG's 81. This is expressed by the factor k, which in this embodiment is an integer number. In an alternative embodiment, the factor k can also be a real number larger or equal to 1. If k>1, signal processing techniques have to be used to make the effective frequency resolution of the acquired signals match that of the D/A converters in the AWG's 81.

The spectral information in the frequency bins for the acquired waveforms provide information of the reflection coefficients versus bandwidth. It is this information that is used in the iterations/optimization of the injection signals. For this purpose frequency mapping is applied to overcome the frequency offsets introduced by the mixed IQ/low-IF approach. It must be mentioned that for the acquisition path no phase coherence is required with the signal generation. In fact, if it is desired to capture a frequency band, around the fundamental or harmonics of interest, larger than the bandwidth of the acquisition A/D converters 31 would allow for, the LO frequency (from LO block 2, see FIG. 1) used for down conversion can be shifted, bringing another part of the frequency spectrum in reach of the A/D converters 31. Stepping of the LO frequency for the down conversion of the signals to be acquired is also done for measuring the reflection coefficients at the harmonic frequencies.

With the techniques of the embodiments as described above all relevant information of the reflection coefficients offered to the DUT 1 can be collected and used as input in the iteration/optimization process in achieving the optimum injection signals, facilitating the user with free to specify matching conditions within the frequency bands of interest.

In the particular case of iterating/optimizing the input signal to compensate for the input path amplifier distortion products, additional information of the phase of the input signal is needed. For this, in a further embodiment, the Arbitrary Waveform Generators 81 need to be synchronized with the Analogue-to-digital converters 31 through the use of a marker/trigger (trigger signal as depicted in FIG. 1-3) to allow extraction of the wave phase information. Furthermore, when the bandwidth of the input signal to pre-distort is larger than the bandwidth of the acquisition A/D converters 31 would allow for, the LO frequency used for down conversion can be shifted, bringing another part of the frequency spectrum in reach of the A/D converters 31. In this case, though, also the phase change in the LO frequency stepping must be tracked, through the extra measurement of a reference IF sine wave that can be obtained by direct down-conversion of an RF reference signal (phase coherent with the input and the injection) with the LO frequency.

Figure 7:
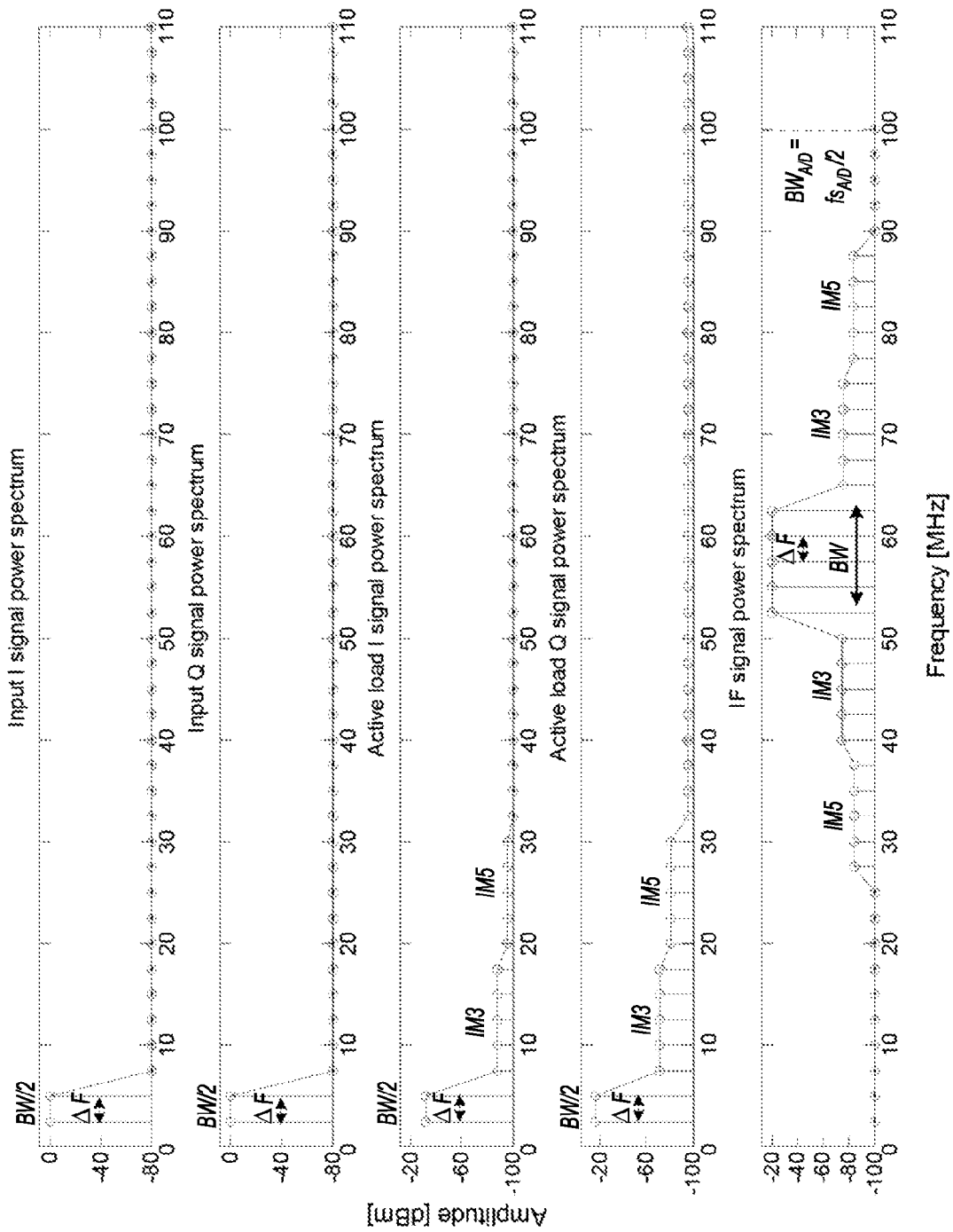
FIG. 7 shows the intermediate frequency power spectrum (bottom graph) of an exemplary wideband modulated signal and the signal power spectra (I and Q) of the active load and input source signal.

Note that the controllable signal bandwidth of the digital-to-analog converters in the AWG's 81 (usually implemented using commercially available D/A cards) should exceed the requirements of the modulation standard to be tested for. This can be understood as follows. The original modulated signal provided by the source will (in the case of a transistor as DUT 1) not only be amplified by the DUT 1 but also distorted, causing IM3 and IM5 related frequency products as well as higher harmonics. These frequency mixing products expand the bandwidth of the original signal. Consequently, in order to be able to offer the proper/realistic reflection signals also for these frequency mixing products, the bandwidth that can be controlled by the injection signals should be significantly larger than the bandwidth of the modulated source signal itself. This is illustrated in the power spectrum graphs as plotted in FIG. 7, which show frequency considerations related to the source signal generation, and the injection signals at the fundamental and $2^{nd}$ harmonic assuming low IF frequency down-conversion of the frequency bands of interest around the fundamental and harmonics.

As shown in the block diagram of FIGS. 1, 2b and 2c, data is transmitted from wideband A/D converters 31 to the AWG's 81. As the measurement system is usable for high frequencies and complex modulation schemes, such as W-CDMA signal testing, the data amount transmitted can be very large. In a practical implementation this can be met using fast datalinks between the various hardware cards, e.g. using PXI or PXI express interfaces.

Although the above embodiments of the present invention have been described for a DUT 1 having a source side and a load side requiring single ports each, the invention may also be applied in measurement system implementations for testing multi-port devices, such as three port or four port devices.

In a further embodiment, the reflection coefficients can be defined not only versus frequency for the frequency bands around the fundamental and harmonic frequencies at input and output (static condition) but can be also defined to follow a pre-described trajectory versus time (dynamic condition). Note that such a feature would allow the operator of the load-pull system to mimic realistic circuit conditions that occur in high efficiency amplifiers that use load modulation. Examples of these amplifiers are: Doherty, LINC or dynamic loadline amplifiers. In these amplifiers the effective load (reflection coefficient changes with the envelope of the modulated input signal, in order to optimize the voltage swing over the output stage yielding an increase in amplifier efficiency. Note that the proposed hardware setup allows such a feature, only the optimization algorithm for the reflection coefficients need to be modified in order to handle the time varying reflection coefficients.

EXAMPLES

Figure 5A:
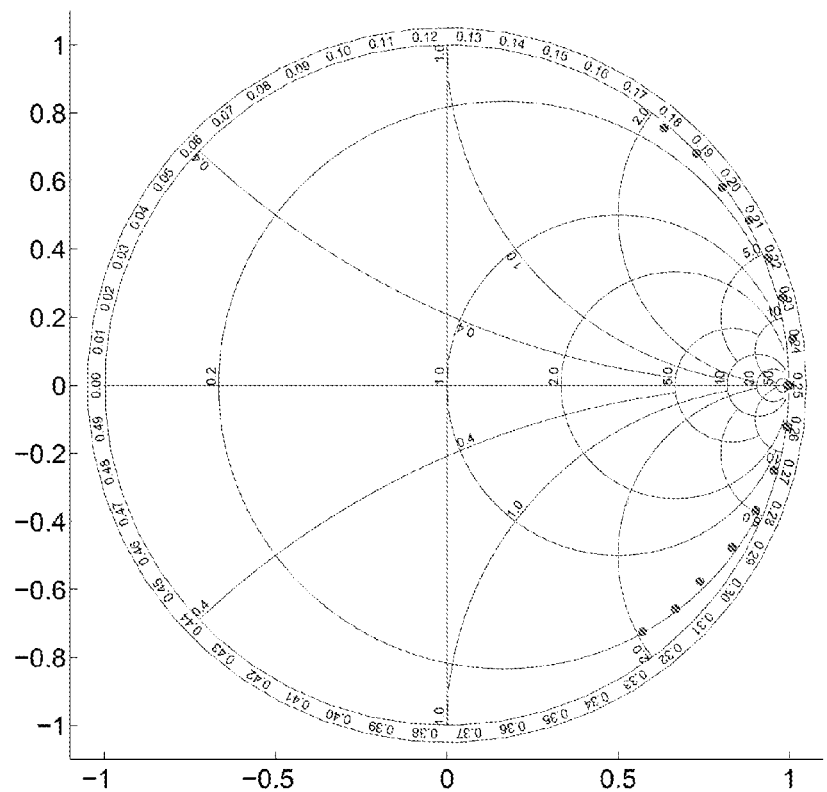
FIGS. 5a and 5b show Smith charts for the uncorrected (a) and corrected (b) reflection coefficient offered to the device under test for a 14 tone input signal with 15 MHz bandwidth.
Figure 5B:
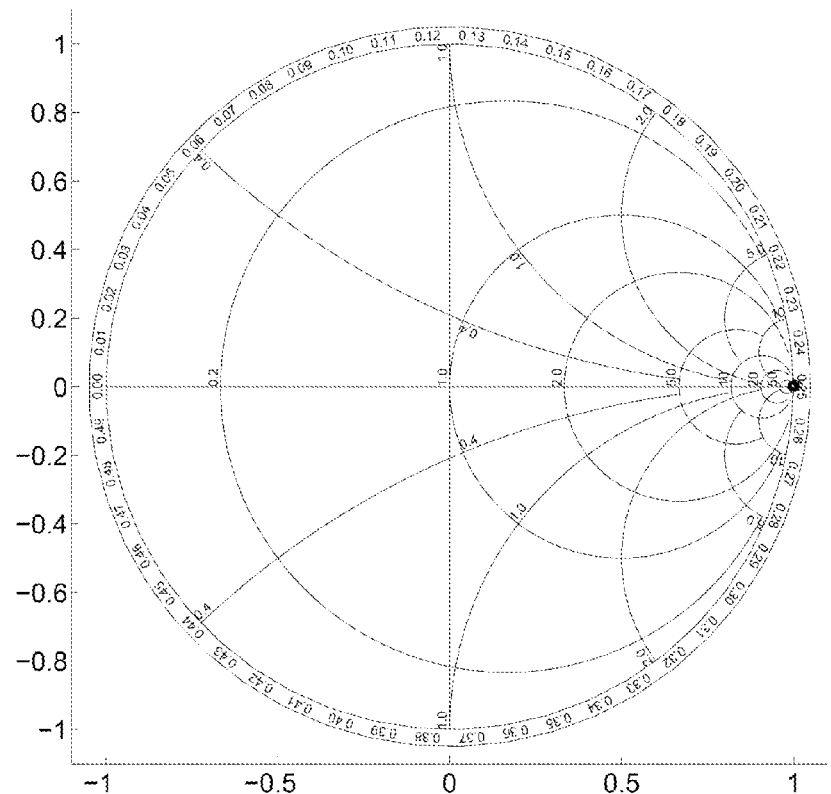
Figure 8:
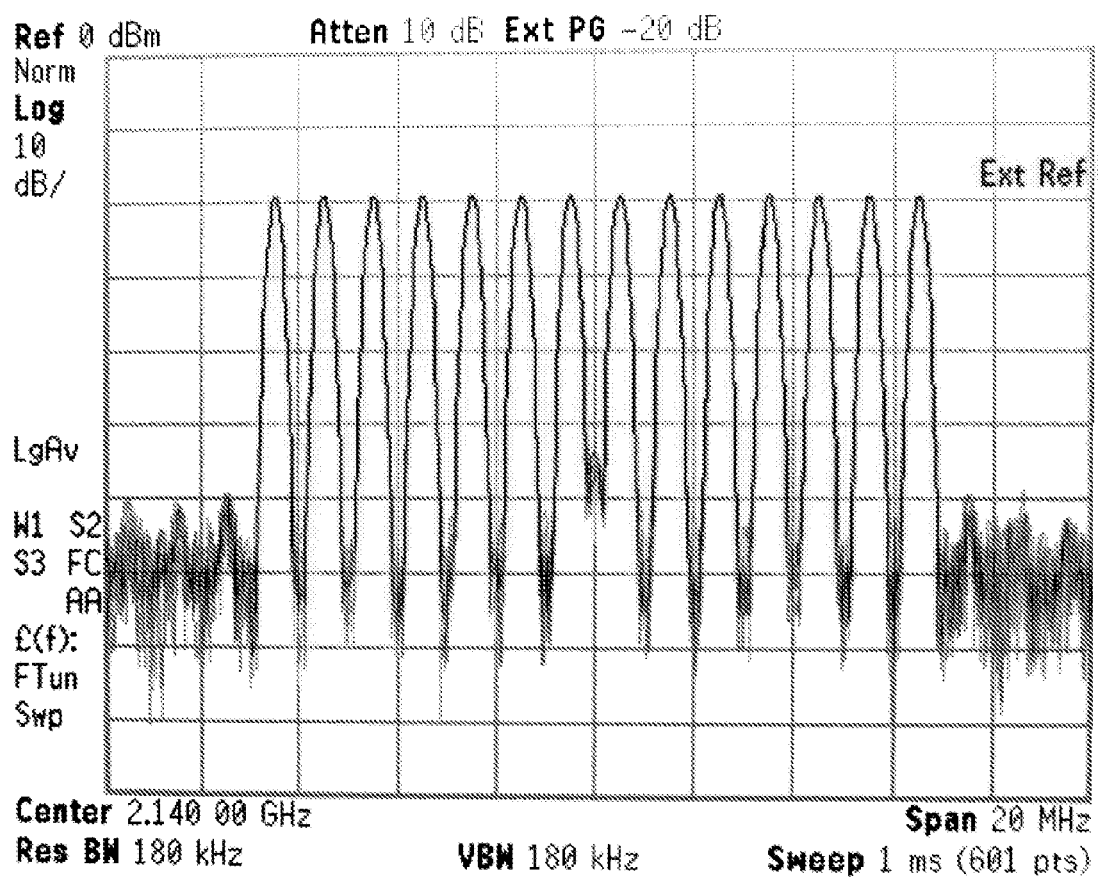
FIG. 8 shows a signal spectrum for the 14 tone input signal as used in the example to which FIGS. 5a and 5b refer.

The functionality of such a load-pull characterization system is demonstrated in FIGS. 5a and 5b which show the uncorrected (a) and corrected (b) reflection coefficient offered to the device under test 1 output for a 14 tone input signal with 15 MHz bandwidth in the form of Smith-charts. Both the input signal, as well the injection signals are generated using the synchronized AWG's 81, which use the same clock and data record length to store the waveforms. All signals are coherently up-converted as described with respect to FIG. 2c. In FIG. 8 a spectral diagram is shown of this 14 tone input signal, centered at 2.14 GHz. FIG. 5a shows measured reflection coefficient of 14 frequency tones in the proposed active load pull system over a frequency bandwidth of 15 MHz, when no compensation is present for the electrical delay and gain variation in the load pull system over this frequency range. So in this case the injection signals are not found by optimization for each tone, but set similar to the conditions needed for achieving $\Gamma_L=1$ for the central frequency. Consequently, note that only at the central frequency of 2.14 GHz the intended reflection condition ($\Gamma_L=1$) is achieved. In FIG. 5b the results are shown when the electrical delay and gain variations are compensated in the digital domain by using iteration/optimization techniques as described above for the 14 frequency tones to achieve the desired reflection condition ($\Gamma_L=1$) for all frequencies. Note that now for all frequencies the intended reflection condition ($\Gamma_L=1$) is achieved.

Figure 6:
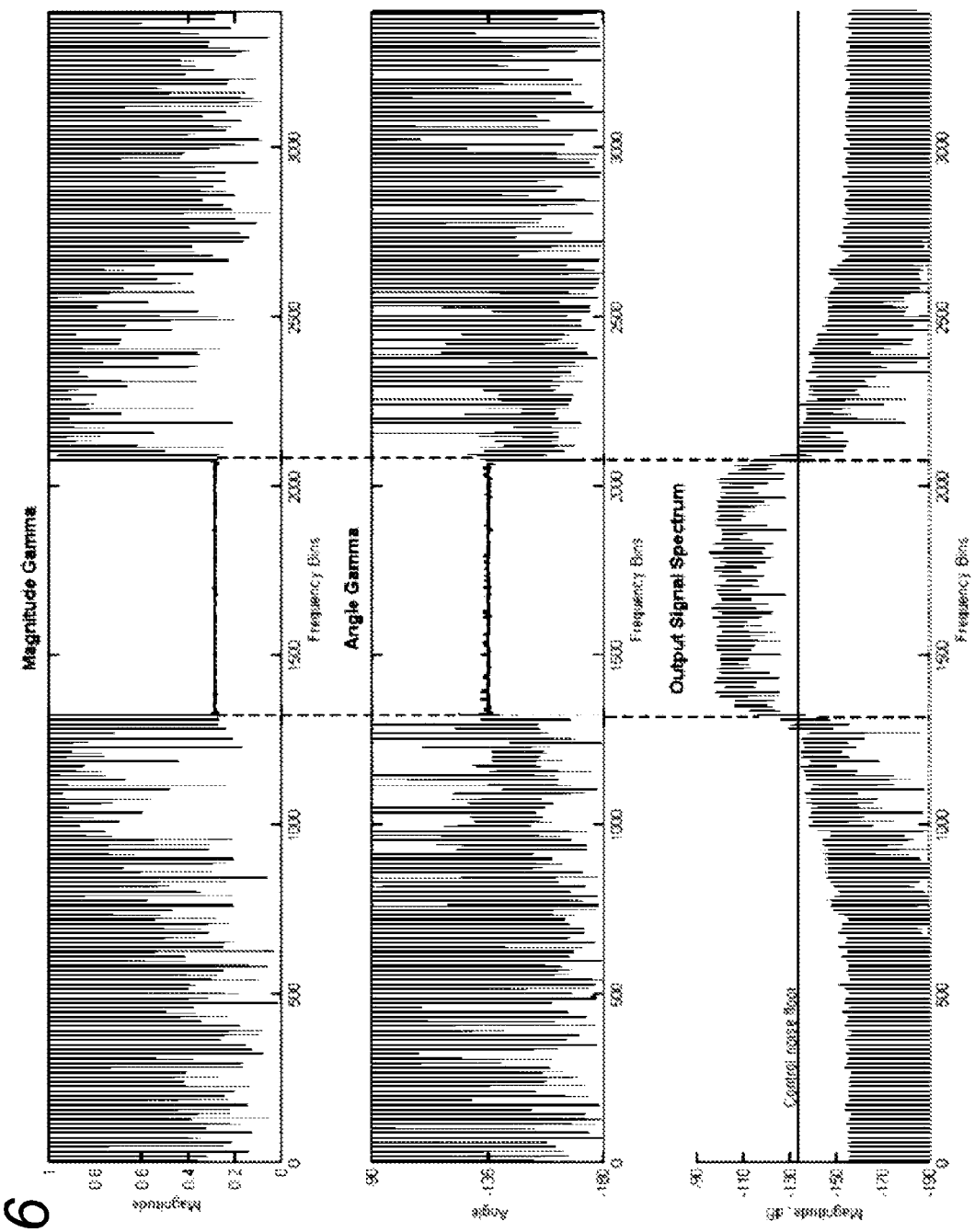
FIG. 6 shows an example of a W-CDMA test signal in the bottom graph of FIG. 6, which has a fundamental frequency $f_0=2.14$ GHz, and the magnitude and phase of the output reflection coefficient for all frequency bins.

The use of complex modulated signals is also feasible. In this case the waveform used as an input signal preferably meets all the requirements of the modulation standard as defined by the test models for the various communication standards. This requires that the record length used to store all the modulated waveforms (both for driving input source signal as well as all the injection signals), should be equal and long enough in order to contain a full period of the test model for the complex modulated signal of interest. An example of a W-CDMA test signal is shown in the bottom graph of FIG. 6, which has a fundamental frequency $f_0=2.14$ GHz. A total control bandwidth of 20.4 MHz was used. For the A/D converters in the wideband ADC block 3, a sampling frequency of 100 MHz was applied, and a record length of $2*10^6$ samples. This results for the measurement part in a frequency resolution of 50 Hz, i.e. the total number of frequency bins in this experiment was 3401 (3401*6 kHz providing the 20.4 MHz total control bandwidth. For all these frequency bins the magnitude and phase of the (in this case) output reflection coefficient is plotted as well in the top two graphs of FIG. 6. Note that the proposed method can accurately control the reflection coefficients/gammas in phase and magnitude over a large frequency band, without being hampered by the electrical delay. In fact the reflection coefficients can be chosen arbitrary as function of frequency. In the bottom graph of FIG. 6 the "control noise floor" is indicated as well. Above this level the signal levels are high enough to accurately control the gamma as function of frequency both in phase and magnitude, below this level, the received signals are considered to be too noisy and no power is injected to control the reflection coefficients. This yields high fluctuations of the reflection coefficients, however due to the very low "noise like" signal levels these fluctuations are not important and do not influence the measurement. When increasing the power levels and further reducing the noise floor the reflection coefficients can be controlled over a even larger range since the signals are now higher than the control noise floor. Note the very high dynamic range achieved which underlines the benefits from the proposed setup.

Figure 9:
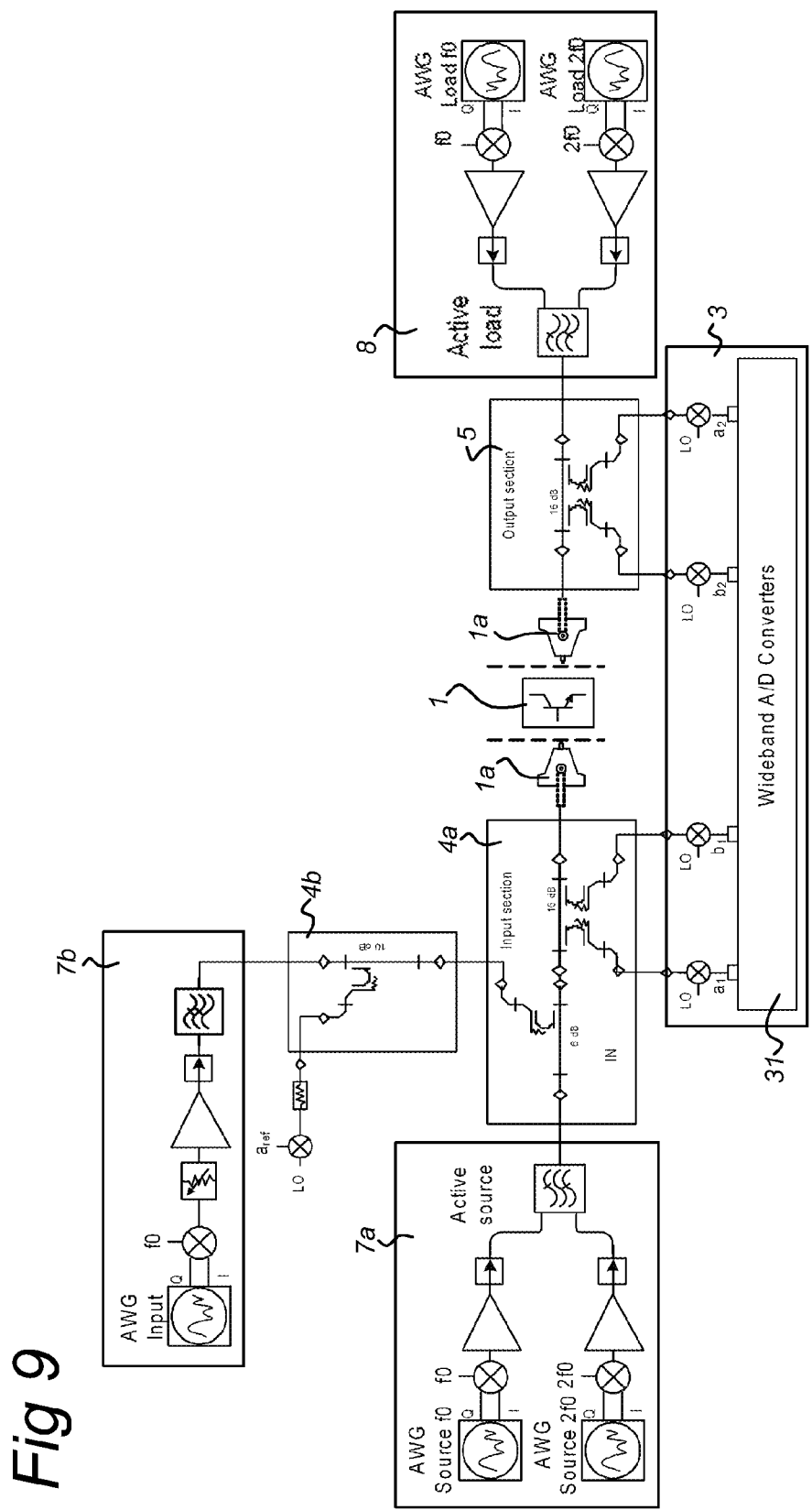
FIG. 9 shows a schematic diagram of a open loop load pull measurement arrangement according to a further embodiment of the present invention.
Figure 10A:
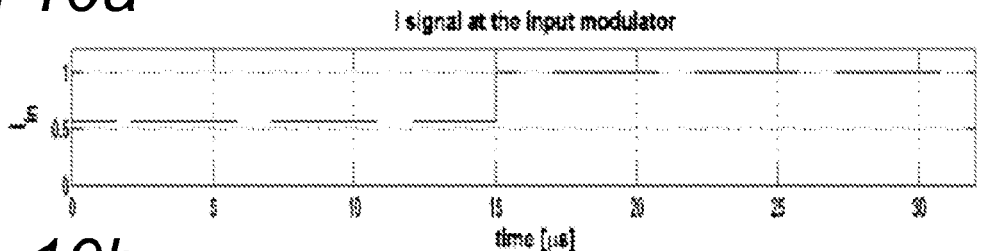
FIG. 10a-10f show examples of time segmented and sequenced wave forms and injection signals as used in an embodiment of the present invention.
Figure 10B:
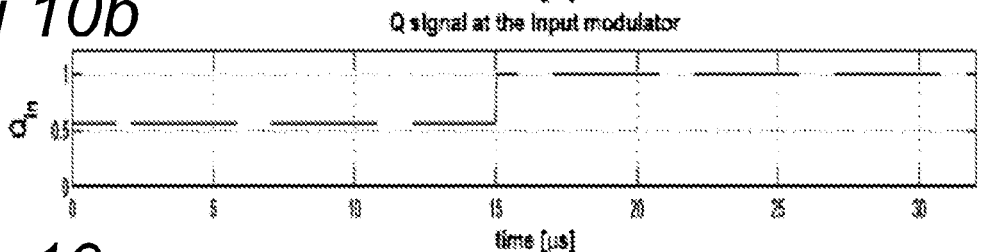
Figure 10C:
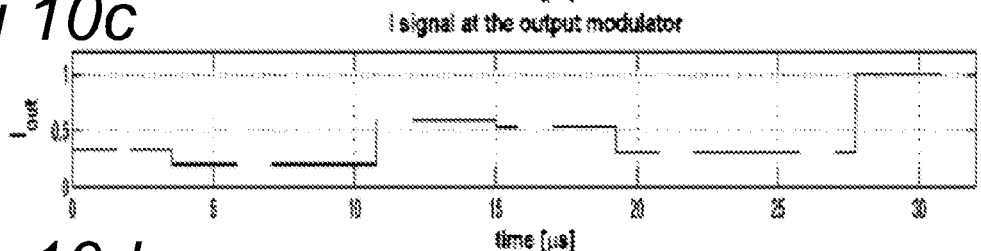
Figure 10D:
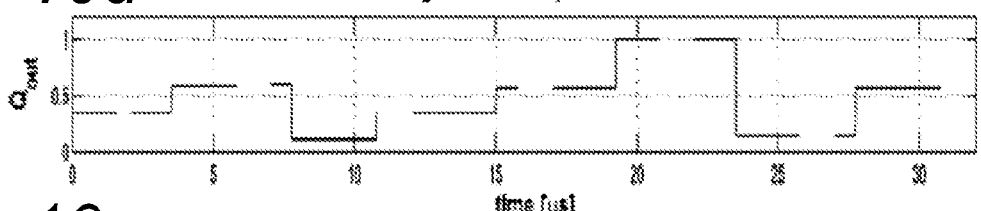
Figure 10E:
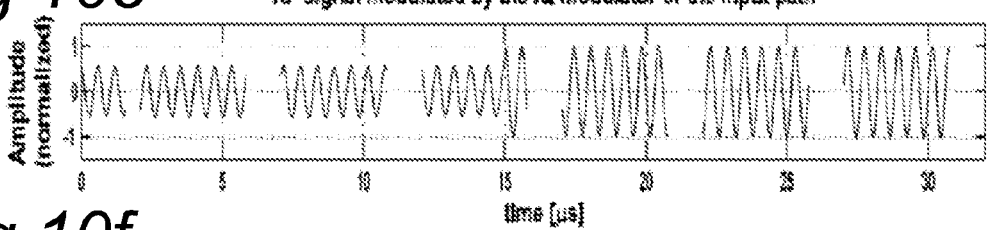
Figure 10F:
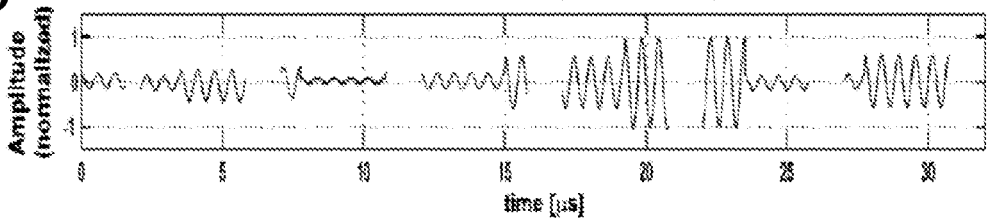

FIG. 9 shows an exemplary set-up of the open loop load pull arrangement as used in a further exemplary embodiment. In this embodiment, only the fundamental frequency and a second harmonic thereof is used for generating the source, load and input injections signals to the device under test 1. Similar as in the schematic diagram of FIG. 1, reflection coefficients are determined at calibration reference planes at the input and output side of the device under test 1, indicated by dashed lines. The generated signals are injected at the device under test 1 using probes 1a (as known to the skilled person).

The generated signals arrive at the probes 1a from an input section 4a and output section 5. Source signals are generated using a source injection signal generator 7a, and input to the input section 4a. An input signal for the device under test 1 is generated by an input injection signal generator 7b, and coupled to the source injection signal using a signal input section 4b and the input section 4a. The signal input section 4b is also arranged to provide measurement data related to the input signal (indicated by $a_{ref}$ and obtained from the input signal using the synchronized local oscillator signal LO). The load injections signal is generated using load injection signal generator 8 coupled to the output section 5. The signal generators 7a, 7b, 8 operate in a similar manner to the corresponding blocks 7 and 8 in FIG. 1 using AWG's as discussed in the corresponding embodiments above.

Furthermore, a wideband ADC block 3 is provided as in the embodiments described above. As indicated in FIG. 9, now only the coefficients $a_1$, $b_1$, and $a_2$, $b_2$ are derived from the injections signals and fed to the wideband A/D converters 31.

In this embodiment, a new simple but very effective mixed-signal approach is provided that enables fully-controlled, multi-dimensional parameter sweeps, while being able to control all other non-swept parameters to their user pre-defined values. Using this embodiment it is possible to perform high speed device characterization over an arbitrary multi-dimensional parameter sweep using well defined discreet measurement points. For example, device characterization with swept discreet input power points and arbitrarily swept discreet fundamental loading points is possible, while simultaneously controlling all other (harmonic) source and loading conditions to their user pre-defined values. The proposed functionality results in extremely fast as well as very accurate and well defined large-signal device characterization, features that are highly beneficial in the power amplification (PA) design process.

Traditional load-pull measurement techniques are recognized to be of fundamental importance for the large-signal characterization of high-frequency devices, allowing to determine the optimal power amplifier (PA) loading conditions, for any given large-signal quantity (e.g. Gain, Output Power, PAE, intermodulation distortion etc.). Nevertheless, both passive and active techniques are highly demanding in terms of measurement time, especially when it is desired to monitor and control multiple parameters simultaneously, such as fundamental and harmonic terminations, at multiple input power levels. This is usually reflected in extremely long measurement times and slows down the PA design/optimization process.

It is noted that recently several works have been reported in literature, which propose "real-time" load-pull solutions by synthesizing load reflection conditions through analogue modulation techniques (see e.g. the already mentioned US patent application US2007/0194776). All these techniques provide "real-time" a set of load reflection coefficients to the device-under-test (DUT) by injecting into the device a signal composed of one or more frequency components which are offset with respect to the fundamental frequency of the DUT. Although very good results have been achieved with these techniques, their analogue nature still imposes limitations on how many parameters, and how well these parameters (including the non swept ones) can be controlled for their value and/or sweeping range.

The arrangement as provided in this embodiment of the present invention is originally developed to handle wideband complex-modulated signals, makes use of wideband analogue-to-digital converters to capture in one single acquisition the incident and reflected waves at the DUT reference planes 1a. Furthermore, the fundamental and harmonics source and loading conditions offered to the DUT 1 are synthesized by injecting signals that are generated by base-band arbitrary-waveform-generators and up-converted using in-phase/quadrature (IQ) modulators.

In this embodiment the capability to coherently synthesize any arbitrary signal at the fundamentals as well as at the harmonics is used to generate an (arbitrary) sequenced range of input power levels and load conditions in one single-shot measurement, as explained in detail in the following.

In an open-loop active load-pull measurement arrangement (e.g. the one shown in FIG. 9), a signal with controlled phase and amplitude is injected to present to the device-under-test 1a synthetic user specified reflection coefficient. Since in this fully coherent system (as indicated by the use of $f_0$, $2f_0$ and LO throughout the arrangement) it is possible to generate any combination of arbitrary injection signals. The waveforms to be injected into the DUT 1 can be defined at the fundamental and harmonics frequencies, such that they contain multiple sinusoidal time-segments with different amplitude and phase information. This approach facilitates the generation of any arbitrary chosen succession of synthesized load and source terminations, both at the fundamental and harmonic frequencies. Also the test signal driving the DUT 1 is generated in the same way with multiple wave segments that can represent different power levels. The measurement is taken by acquiring all the sequenced waveforms in a single shot with wideband analogue-to-digital converters (in block 31), and by processing every time-segment independently.

It is important to stress that, in contrast to the disclosure of US patent application US2007/0194776, all the waveforms used in the time-segments to be injected at the input, source and load for the fundamental are pure sinusoidal signals with a single constant frequency that is equal to the fundamental operating frequency $f_0$ of the device under test 1. While the frequency of the signals to be injected for the harmonics are exactly equal to these harmonics (i.e. $2f_0$) of the device under test 1. The actual parameter sweep is performed by setting the discreet power and loading conditions through the phase and amplitude conditions of the various time segments.

In order to track accurately the sequenced time segments the data-acquisition part of the measurement arrangement must be fully synchronized with the data-generation part of the measurement arrangement (e.g. through a 10 MHz reference, indicated as LO). Furthermore, the measurement arrangement uses a trigger that indicates the beginning of the sequence time segments with the stepped power and load states.

FIG. 2 shows an example of a time-segmented modulated RF wave, where four different loads are presented to the DUT 1 at two different power levels. The big advantage of this time-segmented method is that multi-dimensional parameter sweeps can be executed in a single shot of the signal generation and data acquisition hardware, while the coherency of the measurement arrangement and some book keeping tracks the information embedded in the individual wave segments. This approach completely eliminates settling times that dominate the overall time in conventional load-pull measurements, while providing a more sophisticated control than what is possible with analogue load modulation methods.

Although a single measurement execution of such a parameter sweep takes only a fraction of a second, something that would already result in an effective load and power sweep, practical situations quite often require accurately controlled power and load conditions. In an open loop system this can only be achieved through successive iterations. In view of this, the coherent mixed-signal IQ generation in the present measurement arrangement embodiment allows to optimize the individual time-segments of the IQ waveforms independently. This is done in a similar way as discussed with reference to FIG. 4 above. In this embodiment, an entire IF waveform is acquired, but every time segment is processed separately to calculate the gamma for every segment (cf. block 44 and 45 in FIG. 4). Subsequently, the measured gamma is compared to a desired gamma for every segment, resulting in a gamma error for every segment (cf. block 46 in FIG. 4. In an iterative loop, the I and Q time segments are recalculated based on the gamma error to compose a new injected waveform (cf. block 49 in FIG. 4).

This offers full control of the applied loading and power conditions to which the DUT 1 is subjected. Note that, for example, this feature can be used to target any given area on the Smith plane, while at the same time sweeping the input power. These multi-dimensional parameter sweeps, embedded in the recorded waves of the arbitrary waveform generators that drive the IQ modulators, are at least two orders of magnitude faster than a conventional approach using only one signal condition at the time to construct a parameter sweep.

To demonstrate the functionality of the realized setup, an LDMOS device was measured at 2.14 GHz with a gate width of 1.8 mm. A drain current and voltage of 13 mA and 28 V respectively were used.

It has been found that this measurement arrangement has the capability to obtain with excellent precision (this in contrast to previous solutions) any arbitrary controlled source and load impedance state at the fundamental and harmonic frequencies. In this example the fundamental-load termination provided to the DUT is swept, the source fundamental is kept constant at the value $\Gamma_s=0.5\angle 90°$, while the $2^{nd}$ harmonic load and $2^{nd}$ harmonic source terminations are kept constant to an open circuit condition. Note that this control of the non-swept parameters is desired when evaluating active device performance for different types of amplifier classes (in this case inverse class-AB).

The ability to select any arbitrary range of reflection coefficients is particularly useful when one wants to only characterize selected areas of the device 1 source or load terminations in the Smith chart, e.g. when avoiding regions where the device behaves potentially instable, or when one wants to avoid loading conditions that can yield failure of the DUT 1 (voltage or thermal breakdown). This is far from trivial when using analogue load modulation methods as used in prior art set-ups.

Figure 11A:
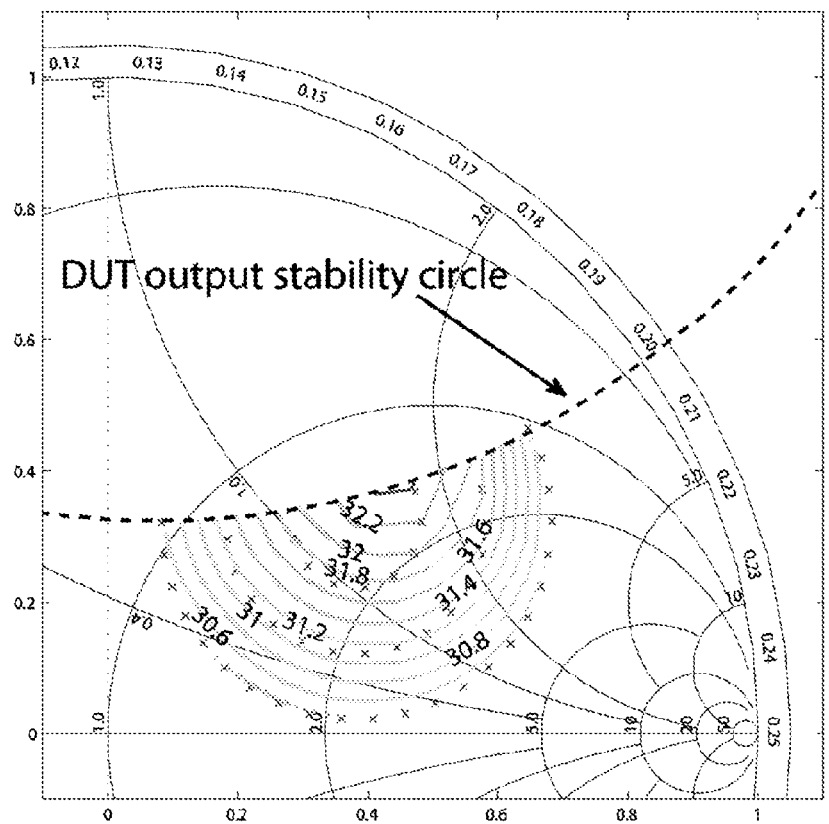
FIG. 11a shows measured output power contours of an exemplary device under test.
Figure 11B:
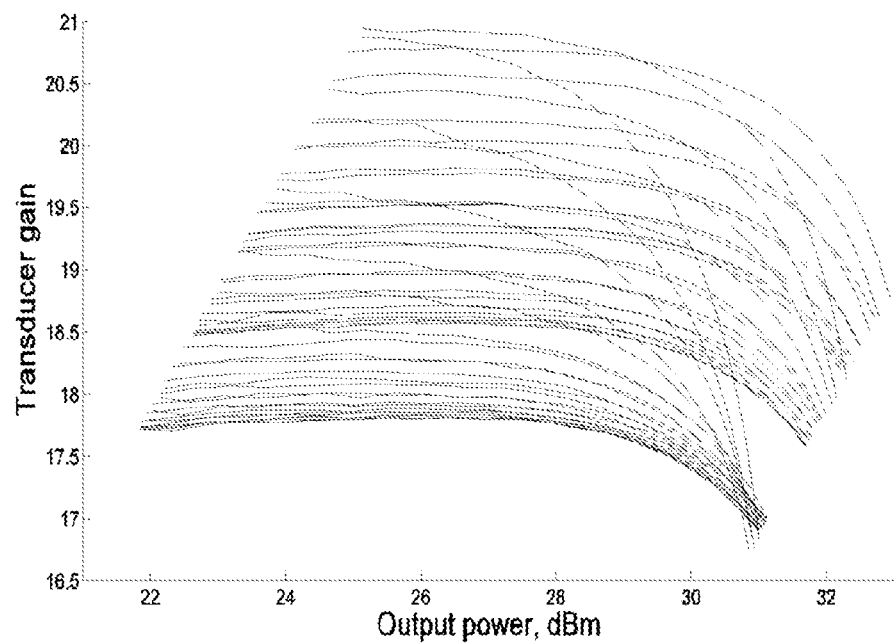
FIG. 11b shows the measured gain as function of the input power for the device under test as subject of FIG. 11a for the different loading conditions.

An example of such a complex measurement is shown in FIGS. 11a and b. Here first the output stability circle was obtained from the small signal S-parameters, after which only the region outside the instable region was addressed in the actual measurement by a fundamental load sweep at various (much higher) power levels. The resulting measured output power contours of the LDMOS device for 13 dBm source available power have been plotted in FIG. 11a. The measured gain as function of input power for the different loading conditions is plotted in FIG. 11b (source and harmonic loading conditions were kept identical to those described before). In this measurement the output power of the device 1 has been obtained for 50 load states at 21 levels of input power. Although a single measurement of the wave segments of these 1050 points only takes a fraction of a second (in this example wave segments were used with a length of 1.6 μs, resulting in 1.68 ms for the total record length), here the total measurement time (including iterations) needed from scratch to reach the final, user pre-defined, controlled input power, fundamental and harmonic source and load reflection coefficients conditions for all 1050 points takes less than 2 minutes. This time span can be reduced even further by optimizing the software for speed.

In the approach as described, very fast stepping from one signal condition to the next one occurs. However at each moment in time the injection frequency is equal to that of the source signal $f_0$ or one of its harmonics. All these segments are placed in sequence and in one shot all the signal conditions are measured with a wide band receiver. Note that this would not be possible with a classical narrowband network analyzer, which would suffer from the sharp transitions from one time segment to the next one. This approach requires a very good synchronization of all injection signals, but also the signal acquisition needs to be fully synchronized with the injection signals and lined up such that within the acquired data segments no transitions in phase or amplitude of the purely sinusoidal signal are present.

In practice when monitoring the spectrum of the injection signals on a spectrum analyzer, the phase and amplitude changes from one segment to the next time segment will cause various frequency components on the spectrum analyser screen, but these components would have an almost random character and will play no role at all in the functioning of the present embodiments.

Note that within one time segment there is only the fundamental and (when using a harmonic system) harmonic frequencies present and no offset frequencies.

This situation is somewhat equivalent with the classical open loop situation. However, in a classical open loop load pull setup, the change in amplitude and phase relations are mostly done by phase shifters and attenuators, which are much slower. If a "conventional setup" makes use of an IQ approach (or vector source) than the data acquisition was never fully synchronized or sufficiently wide band in prior art arrangements, which makes it impossible to implement the proposed approach with such a short sequenced time segments.

The invention claimed is:

1. A measurement arrangement for active load pull measurements of a device under test, comprising
   a wideband analog-to-digital conversion block (3) connected to the source side and load side of the device under test (1) for obtaining measurement data for each of the fundamental and one or more harmonic frequencies at the source and load side of the device under test (1), determining from the measurement data actual measured reflection coefficient versus frequency functions, and determining injections signal parameters by iteratively comparing the actual measured reflection coefficient versus frequency functions with the desired reflection coefficient versus frequency functions,
   a first injection signal generator (7) connected to a source side of the device under test (1) and a second injection signal generator (8) connected to a load side of the device under test (1) for supplying an input source signal and injection signals in order to create predetermined reflection coefficients at respective reference planes of the device under test (1), the predetermined reflection coefficients comprising desired reflection coefficient versus frequency functions at or around a fundamental frequency and at or around one or more harmonic frequencies, the first and second injection signal generator (7, 8) comprising arbitrary waveform generators (81) for converting the injection signal parameters into the injection signals at the source and load side by digital-to-analog conversion,
   in which the wideband analog-to-digital conversion block (3) is connected to couplers (4, 5) which are connected to the source and load side of the device under test (1), and the couplers (4, 5) comprise down-converters (55) of measured signals to obtain intermediate frequency signals,
   and the wideband analog-to-digital conversion block (3) is further arranged for analog-to-digital conversion of the intermediate frequency signals to obtain the actual measured reflection coefficient versus frequency functions with a first frequency resolution, and
   in which the first frequency resolution applied in the analog-to-digital conversion is equal to or better than a second frequency resolution applied in the digital-to-analog conversion.

2. The measurement arrangement of claim 1, further comprising a base band signal generator (9) and associated couplers (11, 12) connected to the device under test (1), for generating a base band signal which is generated coherently with the source signal and injection signals.

3. The measurement arrangement of claim 1, in which the measurement arrangement is further arranged to comprise
   determining injection signal parameters iteratively by starting the iterative process using an actual measured reflection coefficient versus frequency function when no injection signals are applied.

4. The measurement arrangement of claim 1, in which the measurement arrangement is further arranged to comprise
   determining injection signal parameters iteratively by an iteration based on circuit simulator principles, in which the boundary conditions of the device under test are solved simultaneously.

5. The measurement arrangement of claim 1, in which the injection signals at source and load side of the device under test further comprise a baseband signal, which is generated coherently with the injection signals.

6. The measurement arrangement of claim 1, in which the measurement arrangement is further arranged to comprise
   converting the injection signal parameters into the injection signals at the source and load side by digital-to-analog conversion by
   inputting injection signal parameters to a waveform generator for each of the fundamental and one or more harmonic frequencies at both the source and load side to form intermediate injection signals, in which the waveform generators share the same time base and are fully synchronized,
   coherently up-converting each of the intermediate injection signals to the appropriate fundamental and harmonic frequencies to form the actual injection signals.

7. The measurement arrangement of claim 1, in which the digital-to-analog conversion and the analog-to-digital conversion are synchronized to a single coherent source.

8. The measurement arrangement of claim 1, in which the measurement arrangement is further arranged to comprise pre-distorting the input source signal.

9. The measurement arrangement of claim 1, in which the measurement arrangement is further arranged to comprise calculating actual losses and delays in the measurement system and compensating for the calculated actual losses and delays in the predetermined reflection coefficients.

10. The measurement arrangement of claim 1, in which the predetermined reflection coefficients comprise predefined time varying reflection coefficients.

11. The measurement arrangement of claim 1, in which the measurement arrangement is further arranged to comprise providing a plurality of time segmented and sequenced injection signals at the source and load side of the device under test, in which each of the plurality of time segmented and sequenced injection signals comprises the fundamental frequency or a harmonic thereof, and in which one or more of the plurality of time segmented and sequenced injection signals comprises a different amplitude and phase.

12. The measurement arrangement of claim 1, in which the measurement arrangement is further arranged to adapt the amplitude and phase of the plurality of time segmented and sequenced injection signals to obtain a predefined sweep of an operational parameter of the device under test.

13. The measurement arrangement of claim 1, in which the measurement arrangement is further arranged to synchronize digital-to-analog conversion and analog-to-digital conversion to the plurality of time segmented and sequenced injection signals using a trigger signal.

14. A method for providing an active load pull measurement system for a device under test, comprising supplying an input source signal at the source side of the device under test and injection signals at the source and load side of the device under test for creating predetermined reflection coefficients at respective reference planes of the device under test, the predetermined reflection coefficients comprising desired reflection coefficient versus frequency functions at or around a fundamental frequency and at or around one or more harmonic frequencies, and for each of the fundamental and one or more harmonic frequencies:

obtaining measurement data at the source and load side of the device under test and determining from the measurement data actual measured reflection coefficient versus frequency functions, determining injections signal parameters by iteratively comparing the actual measured reflection coefficient versus frequency functions with the desired reflection coefficient versus frequency functions, converting the injection signal parameters into the injection signals at the source and load side by digital-to-analog conversion, in which obtaining measurement data comprises down conversion of measured signals at the source and load side of the device under test to intermediate frequency signals, analog-to-digital conversion of the intermediate frequency signals to obtain the actual measured reflection coefficient versus frequency functions with a first frequency resolution, and in which the first frequency resolution applied in the analog-to-digital conversion is equal to or better than a second frequency resolution applied in the digital-to-analog conversion.

15. The method of claim 14, further comprising providing a plurality of time segmented and sequenced injection signals at the source and load side of the device under test, in which each of the plurality of time segmented and sequenced injection signals comprises the fundamental frequency or a harmonic thereof, and in which one or more of the plurality of time segmented and sequenced injection signals comprises a different amplitude and phase.

16. The method of claim 15, in which the amplitude and phase of the plurality of time segmented and sequenced injection signals are adapted to obtain a predefined sweep of an operational parameter of the device under test.

17. The method of claim 15, in which digital-to-analog conversion and analog-to-digital conversion is synchronized to the plurality of time segmented and sequenced injection signals using a trigger signal.

18. The method of claim 14, in which the source input signal is a wideband signal having a fundamental frequency, and is a periodic signal with a predetermined record length.

19. The method of claim 14, in which determining injection signal parameters iteratively comprises starting the iterative process using an actual measured reflection coefficient versus frequency function when no injection signals are applied.

20. The method of claim 14, in which determining injection signal parameters iteratively comprises an iteration based on circuit simulator principles, in which the boundary conditions of the device under test are solved simultaneously.

21. The method of claim 14, in which the injection signals at source and load side of the device under test further comprise a baseband signal, which is generated coherently with the injection signals.

22. The method of claim 17, in which converting the injection signal parameters into the injection signals at the source and load side by digital-to-analog conversion comprises inputting injection signal parameters to a waveform generator for each of the fundamental and one or more harmonic frequencies at both the source and load side to form intermediate injection signals, in which the waveform generators share the same time base and are fully synchronized, coherently up-converting each of the intermediate injection signals to the appropriate fundamental and harmonic frequencies to form the actual injection signals.

23. The method of claim 14, in which the digital-to-analog conversion and the analog-to-digital conversion are synchronized to a single coherent source.

24. The method of claim 14, further comprising pre-distorting the input source signal.

25. The method of claim 14, further comprising calculating actual losses and delays in the measurement system and compensating for the calculated actual losses and delays in the predetermined reflection coefficients.

26. The method of claim 14, in which the predetermined reflection coefficients comprise predefined time varying reflection coefficients.

* * * * *